United States Patent [19]
Sim

[11] Patent Number: 6,058,499
[45] Date of Patent: May 2, 2000

[54] ERROR CORRECTING METHOD AND DEVICE

[75] Inventor: Tae-hyeon Sim, Seoul, Rep. of Korea

[73] Assignee: Samsung Electronics, Co., Ltd., Suwon, Rep. of Korea

[21] Appl. No.: 08/996,362

[22] Filed: Dec. 22, 1997

[30] Foreign Application Priority Data

Dec. 20, 1996 [KR] Rep. of Korea ...................... 96-69322

[51] Int. Cl.⁷ .................................................. H04M 13/00
[52] U.S. Cl. ........................................... 714/755; 714/746
[58] Field of Search .................................. 714/755, 756, 714/757, 752, 746

[56] References Cited

U.S. PATENT DOCUMENTS

| | | | |
|---|---|---|---|
| 5,383,204 | 1/1995 | Gibbs et al. | 371/37.7 |
| 5,384,786 | 1/1995 | Dudley et al. | 371/37.1 |
| 5,396,502 | 3/1995 | Owsley et al. | 371/37.1 |
| 5,430,739 | 7/1995 | Wei et al. | 371/37.1 |
| 5,444,719 | 8/1995 | Cox et al. | 371/37.1 |
| 5,446,743 | 8/1995 | Zook | 371/371 |
| 5,467,360 | 11/1995 | Lokhoff | 714/755 |
| 5,471,485 | 11/1995 | Tong | 371/37.1 |
| 5,583,499 | 12/1996 | Oh et al. | 341/94 |
| 5,642,366 | 6/1997 | Lee et al. | 371/39.1 |
| 5,659,557 | 8/1997 | Glover et al. | 371/37.1 |
| 5,659,578 | 8/1997 | Alamouti et al. | 375/261 |
| 5,953,265 | 9/1999 | Walton et al. | 714/746 |

*Primary Examiner*—Phung M. Chung
*Attorney, Agent, or Firm*—Marger Johnson & McCollom, P.C.

[57] ABSTRACT

Reed-Solomon encoded data read from a CD-ROM, DVD-ROM, or other recording or transmission source is error corrected at high speed in an apparatus that employs a pair of byte-wide error correcting sub-circuits operating substantially in parallel. An MSB plane of a sector of received Reed-Solomon data is processed in one error correcting circuit while an LSB plane of the same sector is processed in the other circuit. Errors are corrected in each sub-circuit as may be necessary, and selection circuitry selects the corrected data, or non-corrected data, as appropriate, for each plane, and then combines the selected data to form the word-wide output data for transmission, e.g. to a host processor. The operation is pipelined and, although only one error is corrected at a time, the invention provides word-wide, error-corrected data at a data rate only a few clock cycles slower than prior art byte serial EC technology, so the effective transmission rate to the host is substantially improved.

13 Claims, 6 Drawing Sheets

FIG. 1 (PRIOR ART)

```
        START
          │
          ▼
┌──────────────────────────────────┐
│ DECODE Q-CODE WORD OF LSB PLANE  │──10
└──────────────────────────────────┘
          │
          ▼
┌──────────────────────────────────┐
│ DECODE P-CODE WORD OF LSB PLANE  │──12
└──────────────────────────────────┘
          │
          ▼
┌──────────────────────────────────┐
│ DECODE Q-CODE WORD OF MSB PLANE  │──14
└──────────────────────────────────┘
          │
          ▼
┌──────────────────────────────────┐
│ DECODE P-CODE WORD OF MSB PLANE  │──16
└──────────────────────────────────┘
          │
          ▼
         END
```

FIG. 2 (PRIOR ART)

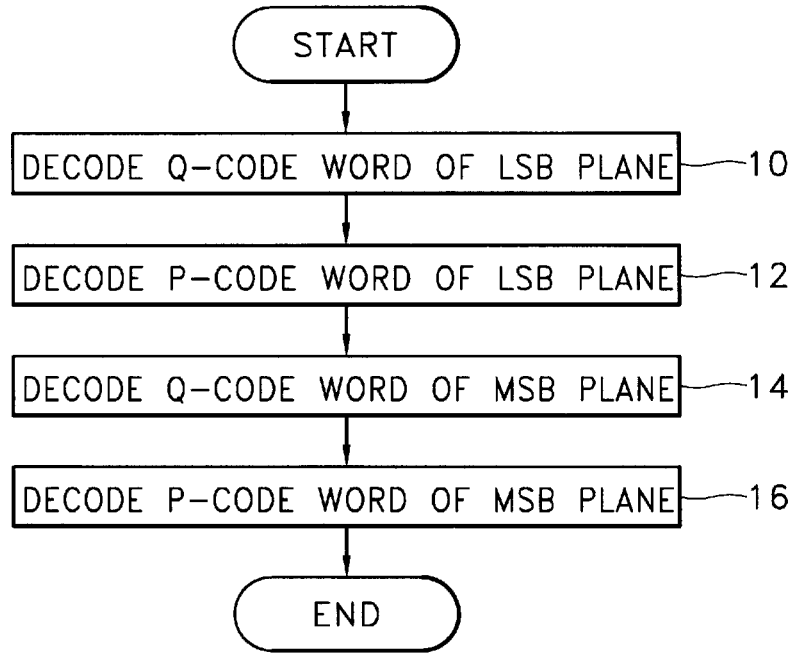

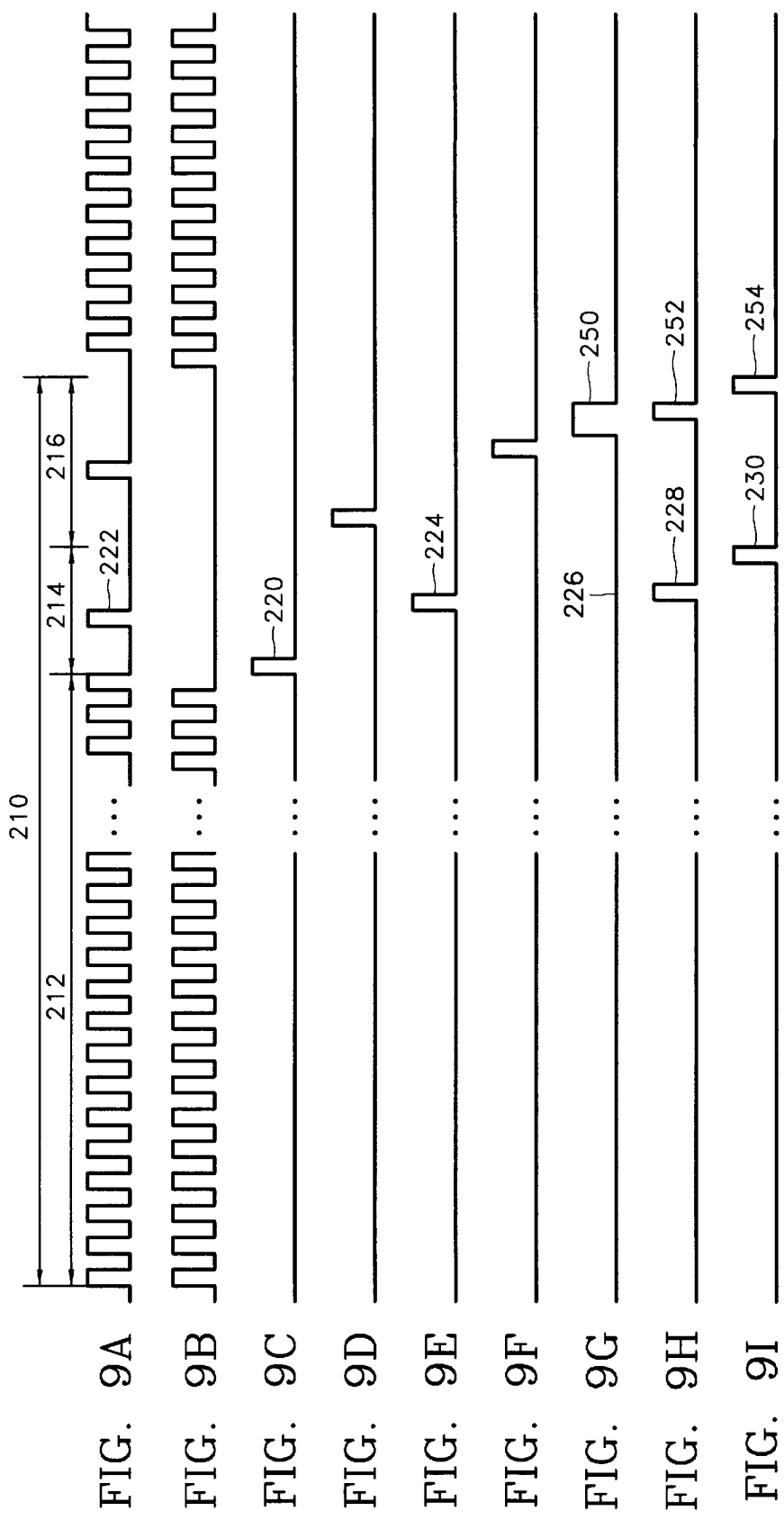

ERROR CORRECTING METHOD AND DEVICE

BACKGROUND OF THE INVENTION

The present invention relates to error correction, and more particularly, to a method for rapidly correcting an error and a device for performing the method.

The operation of a decoder for correcting an error in an optical disk data reproducing system such as a compact disk-read only memory (CD-ROM) or digital versatile disk-ROM (DVD-ROM) system, and other systems requiring error correction will be described. Here, a decoder for a CD-ROM system is given as an example.

The CD-ROM decoder is largely divided into a data input portion, a data error correcting portion, and a data transmitting portion.

The data input portion receives data from a digital signal processor (DSP) for a compact disk player, descrambles the data, and temporarily stores the descrambled data in a buffer memory.

The data error correcting portion reads the data stored in the buffer memory, decodes Q and P code words encoded in the REED-SOLOMON code, and corrects a possibly produced error.

The data transmitting portion receives the error-corrected data and transmits the data to a host computer (not shown).

The structure and operation of a conventional error correcting method and device will be described with reference to the attached drawings.

FIG. 1 is a flowchart for explaining the conventional error correcting method performed in a CD-ROM decoder. The conventional error correcting method is performed by correcting an error in a lower byte of data constituted in word units in steps 10 and 12, and correcting an error in an upper byte of the word-unit data in steps 14 and 16.

FIG. 2 illustrates a data format of a sector. Reference character L-CH denotes the data in a left channel, reference character R-CH denotes the data in a right channel, reference character L denotes a least significant bit (LSB), and reference character M denotes a most significant bit (MSB). Three upper rows 20 represent a synchronization pattern indicating one block, and the next 585 rows 22 represent data patterns. Here, one sector has 2352 bytes or 1176 words.

For example, the first data word '0000' following the synchronization pattern 20 of one block includes its lower byte '0000L' and upper byte '0000M'.

FIG. 3 is an LSB map or LSB plane having only lower bytes selected from the data of one sector shown in FIG. 2. Upper 24 rows 30 represent a header excluding a synchronization pattern, and user data, and the next two rows 32 represent P parity bits. Reference numeral 34 denotes Q parity bits.

An MSB plane takes the same form as that of the LSB plane shown in FIG. 3.

In the conventional error correcting method performed in a CD-ROM decoder, Q code words in the LSB of FIG. 3 are decoded in step 10, since data input to the CD-ROM decoder is encoded in the REED-SOLOMON code in a CD-ROM encoder. In step 12, P code words in the LSB plane are decoded in step 12. Q code words and P code words of the MSB plane are decoded in steps 14 and 16, respectively.

FIG. 4 is a block diagram of a conventional CD-ROM decoder. The conventional CD-ROM decoder has a DRAM 50, a data storing portion 80, an address generating portion 90, and a data error correcting portion 60 including an 8-bit latch 62 an 8-bit buffer 64, and a main error correcting unit 70 which has a syndrome calculator 72, an error calculator 74, and an error corrector 76.

The DRAM 50 of FIG. 4 receives the sector data of FIG. 2 transmitted from a CD-ROM digital signal processor (not shown) and temporarily stores the data.

The data error correcting portion 60 is a conventional error correcting device for performing the method shown in FIG. 1. The 8-bit latch 62 outputs previously latched data to the syndrome calculator 72 simultaneously with latching the data buffered in the DRAM 50 in response to a selection signal C1. The syndrome calculator 72 of the main error correcting unit 70 receives the data from the 8-bit latch 62 in response to a control signal C2 and calculates syndromes SO and SI using the received data. The error calculator 74 receives the syndromes calculated in the syndrome calculator 72 and calculates the location and value of an error.

The error calculator 74 performs a procedure for impossible error correction, if more than two errors are found or an error is located beyond a code range. However, if one error is generated and the error is located in the code range, the error calculator 74 outputs the error location to the address generating portion 90. The address generating portion 90 generates an address ADD corresponding to the received error location to the DRAM 50. The DRAM 50 reads data having the error, which is stored in the address ADD received from the address generating portion 90, and outputs the data to the 8-bit latch 62. The 8-bit latch 62 latches the data having the error and output from the DRAM 50 and outputs the latched data to the error corrector 76.

The error corrector 76 receives the data having the error and output from the 8-bit latch 62 and an error value from the error calculator 74, corrects the error in response to a control signal C3, and outputs the error-corrected data to the 8-bit buffer 64. The data storing portion 80 stores the error-corrected data received from the 8-bit buffer 64 according to a control signal C4.

If a CD-ROM system operates at a low multiple speed like 1× or 2× speed, data is slowly read from a disk, thereby generating no problem in transmitting data to a host computer. On the other hand, in a CD-ROM system operated at an 8× or above speed, buffering, error-correcting, and transmitting rapidly input data are simultaneously performed. Here, the data buffering and error correction are performed in byte units, whereas the data transmission is performed in word units, that is, two-byte units, thus placing constraints on transmission of data to a host computer.

In other words, the conventional CD-ROM decoder of FIG. 4 employs the following pipe line method which simultaneously performs the above three operations. That is, while the data of an Nth sector received from the digital signal processor for a compact disk player is stored in an external buffer RAM, the data error correcting portion corrects an error in the data of an N-1th sector and the data transmitting portion transmits the data of an N-2th sector whose error was corrected to a host computer. Here, since time for storing the data of one sector in the external buffer RAM and time for correcting an error are predetermined, the data transmission to the host computer is performed for the rest time of time for processing the data of one sector in the decoder except for time required for buffering and error correction.

Consequently, the CD-ROM system of a low multiple speed generates no problem with data transmission to the host computer due to a slow transmission rate of data input to the decoder, while the CD-ROM system of a high multiple speed, namely, 8× or above speed may produce a problem with a transmission rate.

SUMMARY OF THE INVENTION

An object of the present invention is to provide a method for correcting an error in word units to reduce error correcting time.

Another object of the present invention is to provide an error correcting device for performing the above error correcting method.

According to one aspect of the invention, a method of error correction of Reed-Solomon encoded digital data is provided. The new method first calls for partitioning a sector of the encoded digital data so as to form an MSB plane of data and an LSB plane of data. The next step comprises byte-sequentially processing a codeword of the MSB plane so as to calculate MSB syndromes. This process is similar to prior art error correction. In addition, substantially simultaneously with said processing a codeword of the MSB plane, the method calls for also processing a corresponding codeword of the LSB plane so as to calculate LSB syndromes.

The next step is correcting an error detected in the MSB plane data so as to form a corrected MSB byte responsive to the caculated MSB syndromes. Likewise, responsive to the caculated LSB syndromes, correcting an error detected in the LSB plane data so as to form a corrected MSB byte. Then the method calls for, for each byte of the of the MSB codeword, selecting the uncorrected byte of data if no error was detected, otherwise selecting the corrected MSB byte. And for each byte of the of the LSB codeword, selecting the uncorrected byte of data if no error was detected, otherwise selecting the corrected LSB byte; and finally, combining the selected MSB byte together with the selected LSB byte to form a corrected word unit. The inventive methodology improves transmission speed of data out of the decoder as the MSB plane and the LSB plane of data are processed—with respect to calculation of syndromes for error correction—in parallel. The two error corrected bytes are then combined to provide word-wide units to the host.

Another aspect of the invention is an error correcting method performed in an error correcting portion of a digital decoder having a data input portion for receiving data from a digital signal processor, said error correcting portion for receiving data having an error among said buffered data and correcting said error, and a data storing portion for storing said error-corrected data, said error correcting method comprising the steps of:

(a) simultaneously correcting an error in Q code words of MSB and LSB planes in word units; and (b) simultaneously correcting an error in P code words of said MSB and LSB planes in word units.

Still another aspect of the invention is directed to an error correcting device in a digital decoder having a data input portion for buffering data received from a digital signal processor, said error correcting device intended for receiving said buffered data and correcting an error in said buffered data, and a data storing portion for storing said error-corrected data. In one example of a presently preferred embodiment said error correcting device includes a first latch for latching 8-bit data of an MSB plane among data received in word units from said data input portion; and a second latch for latching 8-bit data of an LSB plane among data received in word units from said data input portion. A first main error correcting circuit is provided for receiving said data latched in said first latch, calculating a syndrome for said received data, and outputting control signals for indicating impossible error correction and for indicating the presence or absence of an error, the number of errors, and the location and value of an error from said calculated syndrome, and for correcting an error in response to the control signals. The error correcting device further includes a second main error correcting means for receiving said data latched in said second latch, calculating a syndrome for said received data, outputting control signals for indicating impossible error correction and for indicating the presence or absence of an error, the number of errors, and the location and value of an error from said calculated syndrome, correcting an error in response to the control signals, and outputting said error-corrected data. A data selection circuit is arranged for selectively synthesizing the output of said first and/or second main error correcting means, and the output of said first or second latch in response to control signals. A first buffer is provided for buffering said data synthesized in said data selecting means and outputting said buffered data to said data storing portion in word units. In one embodiment, the data selection circuit includes a first multiplexer for selectively outputting said data latched in said first latch and the output of said first main error correcting means in response to said control signal; and a second multiplexer for selectively outputting said data latched in said second latch and the output of said second main error correcting means in response to a corresponding control signal; and a second buffer for latching the output of said first and second multiplexers and outputting said latched data to said first buffer.

BRIEF DESCRIPTION OF THE DRAWINGS

The above objects and advantages of the present invention will become more apparent by describing in detail preferred embodiments thereof with reference to the attached drawings in which:

FIG. 1 is a flowchart for explaining a conventional error correcting method performed in a CD-ROM decoder;

FIG. 2 illustrates a data format of one sector;

FIGS. 9A–9I illustrate the waveforms of control signals for controlling the portions of FIG. 7.

DETAILED DESCRIPTION OF THE INVENTION

Figure 5:
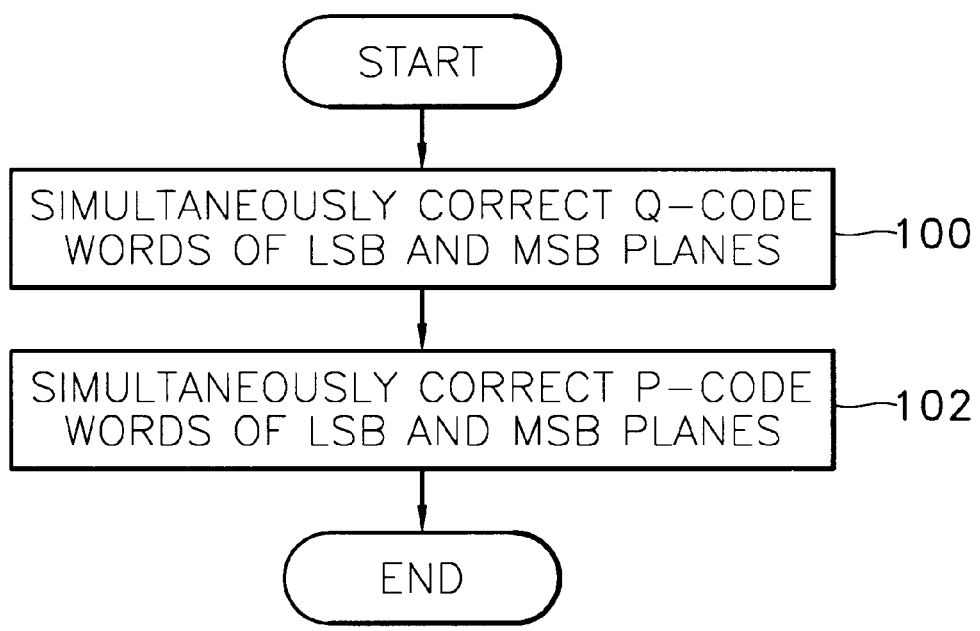
FIG. 5 is a flowchart for explaining an error correcting method according to the present invention.

Referring to FIG. 5, an error correcting method of the present invention is performed by step 100 for correcting Q code words and step 102 for correcting P code words.

Figures 3, 4:
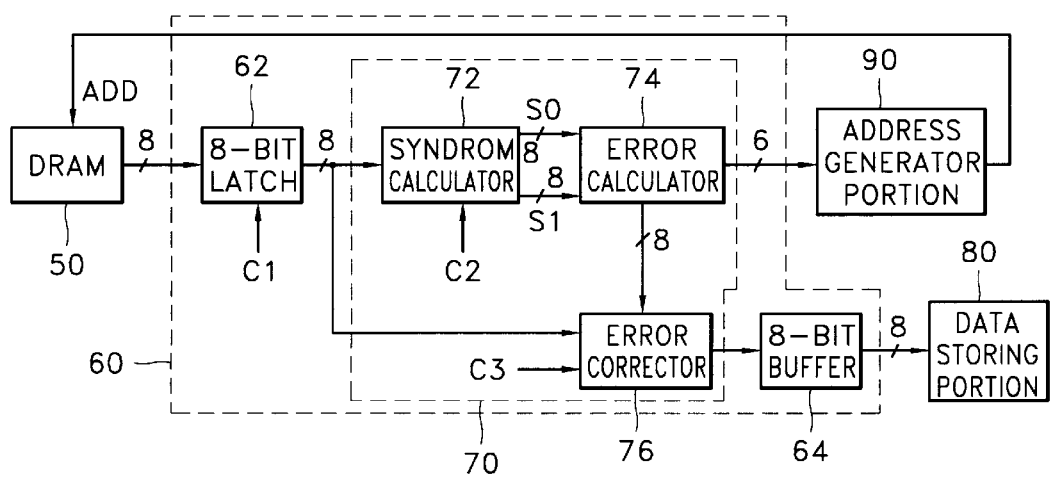
FIG. 3 illustrates an LSB map having only LSB data selected from the data of one sector shown in FIG. 2.
FIG. 4 is a block diagram of a conventional CD-ROM decoder.

In step 100, an error (Q code word-error) in the data of a Q code word of an MSB and a Q code word-error of an LSB shown in FIG. 3 are simultaneously corrected. In step 102, an error (P code word-error) in the data of a P code word of the MSB and a P code word-error of the LSB shown in FIG. 3 are simultaneously corrected.

Figure 6:
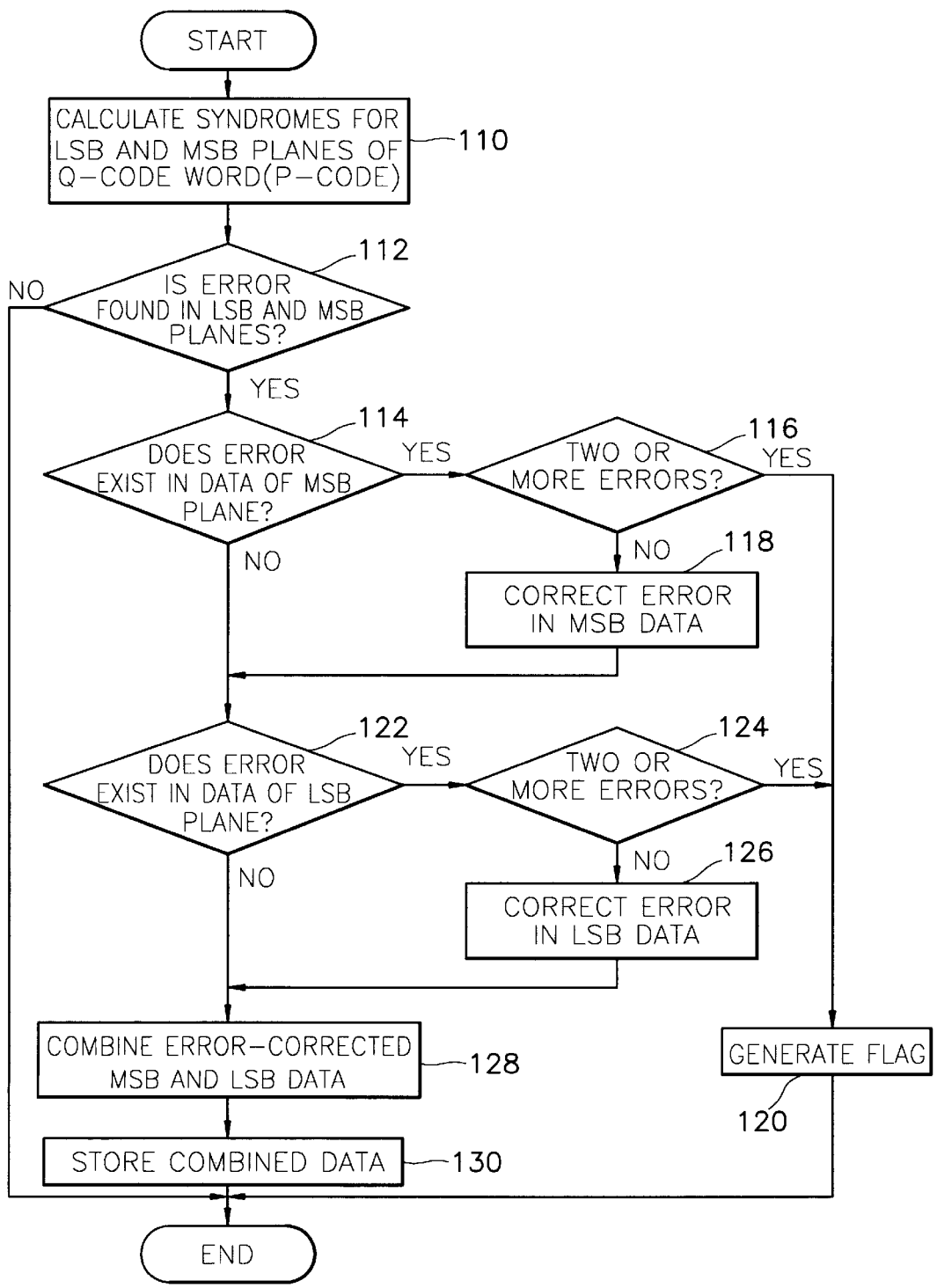
FIG. 6 is an illustrative flowchart for explaining step 100 or 102 shown in FIG. 5, in detail.

FIG. 6 is an illustrative flowchart for explaining step 100 or 102 shown in FIG. 5 in detail. This flowchart has steps 110–126 for simultaneously correcting errors in the data of the MSB and LSB, and steps 128–130 for storing a sum of error-corrected or error-having data.

Step 100 or 102 shown in FIG. 5 will be described referring to FIG. 6. In step 110, syndromes for the MSB and LSB planes of a Q code word (or P code word) received from a data input portion are calculated. In step 112, it is determined whether errors exist in the data of the MSB and LSB planes, using the syndromes calculated in step 110. If no error is found in the data of the MSB and LSB planes in step 112, the error correction procedure is terminated. On the contrary, if an error is found in the data of the MSB and LSB planes, it is determined whether errors exist in the data of the MSB plane in step 114. If errors are found in the data of the MSB plane, it is determined whether the number of the generated errors is two or above in step 116. If the number of the errors is two or above, a flag indicating an impossible error correction is generated in step 120. On the other hand, if a single error is found, the error in the data of the MSB plane is corrected in step 118.

Meanwhile, in step 122, it is determined whether errors exist in the data of the LSB plane when no error is found in the data of the MSB plane or after the error in the data of the MSB plane is corrected. In step 124, it is determined whether the number of the errors is two or above if errors are found in the data of the LSB plane. If the number of the errors existing in the data of the LSB plane is two or above, the procedure goes to step 120 where a flag indicating an impossible error correction is generated. On the other hand, if a single error is found in the data of the LSB plane, the error in the data of the LSB plane is corrected in step 126. When no error is found in the data of the LSB plane or after the error existing in the data of the LSB plane, the error-corrected or error-having MSB and/or LSB data is summed in step 128. The summed data is stored in the data storing portion in step 130.

Though error correction is performed on the data of the MSB plane before the data of the LSB plane in the method of FIG. 6, the sequence can be reversed.

The structure and operation of an error correcting device for the above error correcting method according to the present invention will be described referring to the attached drawings.

Figure 7:
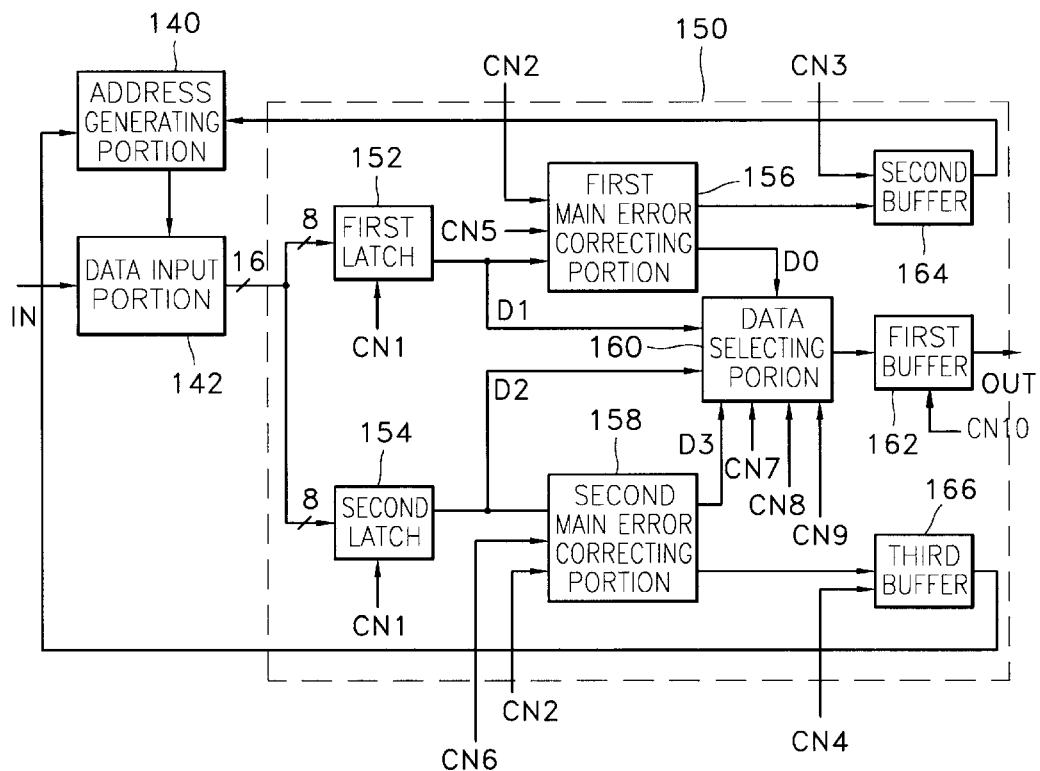
FIG. 7 is a block diagram for explaining an error correcting device according to the present invention.

FIG. 7 is a block diagram for explaining the error correcting device of the present invention. In the block diagram are an address generating portion 140, a data input portion 142, and the error correcting device of the present invention including first and second latches 152 and 154, first and second main error correcting portions 156 and 158, a data selecting portion 160, and first to third buffers 162, 164, and 166.

The data input portion 142 of FIG. 7 buffers data received from a decoder (not shown) via an input terminal IN, separates the buffered 16-bit data into 8-bit MSB data and 8-bit LSB data, and outputs both 8-bit data to the first and second latches 152 and 154, respectively. The first and second latches 152 and 154 output previously latched data to corresponding main error correcting portions simultaneously with latching the MSB and LSB data in response to a first control signal CN1. The error correcting portions thus operate in parallel.

The first and second main error correcting portions 156 and 158 are the same as the main error correcting unit 70 of FIG. 4 in terms of structure and operation. That is, the first or second main error correcting portion 156 or 158 receives the MSB or LSB data from the first latch 152 or second latch 154, calculates a syndrome in response to a second control signal CN2 generated N times from the input data, and determines the presence or absence of an error, the number of errors, and the location and value of an error, using the calculated syndrome. Here, N is 45 with a Q code word to be error-corrected, and 26 with a P code word to be error-corrected, respectively.

The first or second main error correcting portion 156 or 158 outputs an error location to the second or third buffer 164 or 166. The second or third buffer 164 or 166 buffers the error location in response to a third or fourth control signal CN3 or CN4, and outputs the buffered error location to the address generating portion 140. The address generating portion 140 outputs an address corresponding to the error location to the data input portion 142. The data input portion 142 outputs the data stored in the received address to MSB or LSB error corrector (not shown) of the first or second main error correcting portion 156 or 158 via the first or second latch 152 or 154. Here, the MSB or LSB error corrector corresponds to the error corrector 76 of FIG. 4.

The MSB or LSB error corrector corrects a data error in response to a fifth or sixth control signal CN5 or CN6 by means of error data received from a corresponding latch and an error value received from the error calculating portion, and outputs the error-corrected data to the data selecting portion 160.

The data selecting portion 160 receives the output of the data from the first and/or second main error correcting portion 156 and/or 158, and/or the output of the first or second latch 152 or 154, selects the input data in response to seventh and eighth control signal CN7 and CN8, and outputs the selected data to the first buffer 162 in response to a ninth control signal CN9.

Figure 8:
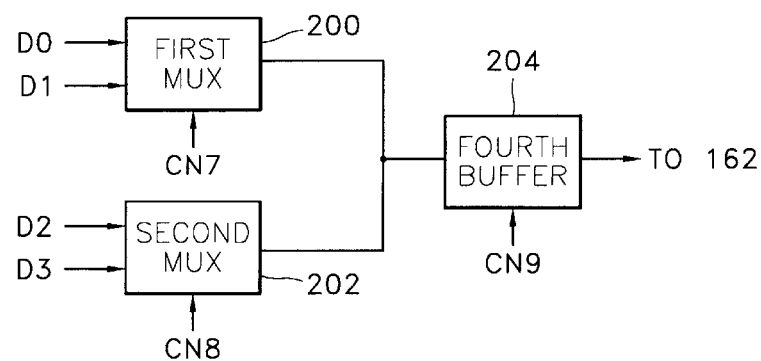
FIG. 8 is a block diagram of a preferred embodiment of a data selecting portion according to the present invention.

FIG. 8 is a block diagram of a preferred embodiment of the data selecting portion 160 according to the present invention. The data selecting portion 160 has a first multiplexer (MUX) 200, a second MUX 202, and a fourth buffer 204.

The first MUX 200 of FIG. 8 receives data D0 whose error is corrected in the first main error correcting portion 156 and data D2 output from the first latch 152, selects one of the input data in response to the seventh control signal CN7, and outputs the selected data to the fourth buffer 204. The second MUX 202 receives data D2 from the second latch 154 and data D3 whose error is corrected in the second main error correcting portion 158, selects one of the input data in response to the eighth control signal CN8, and outputs the selected data to the fourth buffer 204.

The fourth buffer 204 buffers the output of the first and second MUXes 200 and 202 in response to the ninth control signal CN9, and outputs the buffered data to the first buffer 162 via an output terminal OUT.

Meanwhile, the first buffer 162 stores error-corrected data output from the data selecting portion 160 in response to a tenth control signal CN10, and the stored data can be read via OUT to be transmitted to a host computer if necessary.

A controlling portion (not shown) outputs the first to tenth control signals to corresponding portions in accordance with the presence or absence of an error in the data stored in the data input portion 142 of FIG. 7. The control signals will be described in detail with description of the operation of the error correcting device under conditions.

FIGS. 9A–9I illustrate the waveforms of control signals for controlling the device of FIG. 7. FIGS. 9A–9C show the waveforms of the first to third control signals, respectively. FIGS. 9D–9F show the waveforms of the fourth to sixth control signals, respectively. FIG. 9G shows the waveform of the seventh or eighth control signal. FIGS. 9H and 9I show the waveforms of the ninth and tenth control signals.

OPERATION IN A PRESENTLY PREFERRED EMBODIMENT

First Example

First, it is assumed that MSB data input to the first and second latches 152 and 154 has an error, and LSB data input to the first and second latches 152 and 154 has no error.

The first and second latches 152 and 154 in the error correcting device of FIG. 7 output previously latched MSB and LSB data to the first and second main error correcting portions 156 and 158, simultaneously with receiving the MSB and LSB data from the data input portion in response to the first control signal CN1 shown in FIG. 9A.

The first and second main error correcting portions 156 and 158 calculate syndromes, the number of errors, and the value and location of an error simultaneously in response to the second control signal CN2 (212) generated N times as shown in FIG. 9B. The second buffer 164 buffers the error location in response to the third control signal CN3 of a high level shown in FIG. 9C, and outputs the buffered error location to the address generating portion 140. The first main error correcting portion 156 corrects a data error in response to the fifth control signal CN5 of a high level shown in FIG. 9(e) by means of error data and an error value received from the first latch in response to the first control signal CN1 of a high level shown in FIG. 9A, and outputs the error-corrected data DO to the first MUX 200. Here, the second main error correcting portion 158 performs no error correction due to the absence of an error in the LSB data.

The first MUX 200 of the data selecting portion 160 selects the error-corrected MSB data D0 in response to the seventh control signal of a low level shown in FIG. 9G, and outputs the selected data to the fourth buffer 204. The second MUX 202 selects the data D2 output from the second latch 154 in response to the eighth control signal CN8 (226) of a low level shown in FIG. 9G. The fourth buffer 204 sums 8-bit data received from the MUXes, and outputs the summed 16-bit, namely, one-word data to the first buffer 162 in response to the ninth control signal CN9 (228) of a high level shown in FIG. 9H. The first buffer 162 outputs the received data to the data storing portion (not shown) via the output terminal OUT in response to the tenth control signal CN10 (230) of a high level shown in FIG. 9(i).

Second Example

Second, it is assumed that MSB data input to the first and second latches 152 and 154 from the data input portion 142 has no error and LSB data input to the first and second latches 152 and 154 from the data input portion 142 has an error.

Here, the operations of the first main error correcting portion 156 and the first latch 152 under the first condition are performed by the second main error controlling portion 158 and the second latch 154, respectively.

Only the operation of the data selecting portion 160 is changed. That is, the first MUX 200 of the data selecting portion 160 selects the MSB data Dl output from the first latch 152 in response to the seventh control signal CN7 (250) of a high level shown in FIG. 9G, and outputs the selected data to the fourth buffer 204. The second MUX 202 selects the LSB data D3 whose error is corrected in the second main error correcting portion 158 in response to the eighth control signal CN8 (250) of a high level shown in FIG. 9G. The fourth buffer 204 sums 8-bit data received from the MUXes and outputs the summed 16-bit, namely, one-word data to the first buffer 164 in response to the ninth control signal CN9 (252) of a high level shown in FIG. 9H. The first buffer 162 outputs the received data to the data storing portion via the output terminal OUT in response to the tenth control signal (254) of a high level shown in FIG. 9I. That is, the error correcting device corrects an error in the LSB data and stored the error-corrected data during a period 216 shown in FIG. 9.

Third Example

Third, it is assumed that both MSB and LSB data input to the first and second latches 152 and 154 from the data input portion 142 have errors. In addition, it is assumed that the LSB data is corrected after the MSB data. The error correcting device of the present invention shown in FIG. 7 can correct an error in the LSB data after correcting the MSB data, or vice versa. However, it cannot correct errors in the MSB and LSB data, simultaneously, with onlyone address generator to access the input buffer.

The first main error correcting portion 156 and the first latch 152 perform the operations under the first condition, and the second main error correcting portion 158 and the second latch 154 perform the operations under the second condition.

Here, the first MUX 200 selects the MSB data whose error is corrected in the first main error correcting portion 156 in response to the seventh control signal CN7 (226) of a low level shown in FIG. 9G. The second MUX 202 selects the LSB data whose error is corrected in the second main error correcting device 158 in response to the seventh control signal CN7 (250) of a high level shown in FIG. 9(g).

Consequently, the error correcting device of the present invention reduces time for error correction and can utilize the saved time in data transmission, due to the simultaneous correction of errors in the MSB and LSB planes.

Though the present invention has been described and illustrated with a CD-ROM, the present invention can be applied to other optical disk data reproducing systems such as a DVD-ROM system.

As described above, the error correcting method and device for an optical disk data reproducing system according to the present invention can increase a data transmission speed to a host computer because error correction is performed in word units.

What is claimed is:

1. An error correcting method performed in an error correcting portion of a digital decoder having a data input portion for receiving data from a digital signal processor, said error correcting portion for receiving data having an error among said data and correcting said error, and a data storing portion for storing said error-corrected data, said error correcting method comprising the steps of:
   (a) simultaneously correcting an error in Q code words of most significant bit and least significant bit planes in word units; and
   (b) simultaneously correcting an error in P code words of said most significant bit and least significant bit planes in word units.

2. An error correcting method as claimed in claim 1, wherein said step (a) comprises the steps of:
   c) calculating syndromes for said MSB and LSB planes of said Q code words;
   (d) determining whether errors exist in data of said MSB and LSB planes by means of said calculated syndromes;

(e) correcting errors in said MSB plane according to the number of the errors or performing a procedure for an impossible error correction, if errors are found in the data of said MSB plane;

(f) determining whether errors exist in data of said LSB planes, if no error is found in the data of said LSB plane;

(g) correcting errors in said LSB plane according to the number of the errors or performing a procedure for an impossible error correction, if errors are found in the data of said LSB plane;

(h) adding the data of said MSB plane to the data of said LSB plane, if no error exists in the data of said LSB plane or after errors existing in the data of said LSB are corrected; and (i) sending said added data to said data storing portion.

3. An error correcting method as claimed in claim 1, wherein said step (b) comprises the steps of:

(c') calculating syndromes for said MSB and LSB planes of said P code words;

(d') determining whether errors exist in data of said MSB and LSB planes by means of said calculated syndromes;

(e') correcting errors in said MSB plane according to the number of the errors or performing a procedure for an impossible error correction, if errors are found in the data of said MSB plane;

(f') determining whether errors exist in data of said LSB planes, if no error is found in the data of said LSB plane;

(g') correcting errors in said LSB plane according to the number of the errors or performing a procedure for an impossible error correction, if errors are found in the data of said LSB plane;

(h') adding the data of said MSB plane to the data of said LSB plane, if no error exists in the data of said LSB plane or after errors existing in the data of said LSB are corrected; and (i') sending said added data to said data storing portion.

4. An error correcting method as claimed in claim 1, wherein said step (a) comprises the steps of:

(c") calculating syndromes for said MSB and LSB planes of said Q code words;

(d") determining whether errors exist in data of said MSB and LSB planes by means of said calculated syndromes;

(e") correcting errors in said LSB plane according to the number of the errors or performing a procedure for an impossible error correction, if errors are found in the data of said LSB plane;

(f") determining whether errors exist in data of said MSB planes, if no error is found in the data of said MSB plane;

(g") correcting errors in said MSB plane according to the number of the errors or performing a procedure for an impossible error correction, if errors are found in the data of said MSB plane;

(h") adding the data of said MSB plane to the data of said LSB plane, if no error exists in the data of said MSB plane or after errors existing in the data of said MSB are corrected; and (i") sending said added data to said data storing portion.

5. An error correcting method as claimed in claim 1, wherein said step (b) comprises the steps of:

(c''') calculating syndromes for said MSB and LSB planes of said P code words;

(d''') determining whether errors exist in data of said MSB and LSB planes by means of said calculated syndromes;

(e''') correcting errors in said LSB plane according to the number of the errors or performing a procedure for an impossible error correction, if errors are found in the data of said LSB plane;

(f''') determining whether errors exist in data of said MSB planes, if no error is found in the data of said MSB plane;

(g''') correcting errors in said MSB plane according to the number of the errors or performing a procedure for an impossible error correction, if errors are found in the data of said MSB plane;

(h''') adding the data of said MSB plane to the data of said LSB plane, if no error exists in the data of said MSB plane or after errors existing in the data of said MSB are corrected; and (i''') sending said added data to said data storing portion.

6. An error correcting device in a digital decoder having a data input portion for buffering data received from a digital signal processor, said error correcting device for receiving said buffered data and correcting an error in said buffered data, and a data storing portion for storing said error-corrected data, said error correcting device comprising:

a first latch for latching 8-bit data of an MSB plane among data received in word units from said data input portion;

a second latch for latching 8-bit data of an LSB plane among data received in word units from said data input portion;

first main error correcting means for receiving said data latched in said first latch, calculating a syndrome for said received data, outputting a 1-1 control signal by determining the presence or absence of an error, the number of errors, and the location and value of an error from said calculated syndrome, correcting an error in response to a 2-1 control signal, and outputting said error-corrected data;

second main error correcting means for receiving said data latched in said second latch, calculating a syndrome for said received data, outputting a 1-2 control signal by determining the presence or absence of an error, the number of errors, and the location and value of an error from said calculated syndrome, correcting an error in response to a 2-2 control signal, and outputting said error-corrected data;

data selecting means for selectively synthesizing the output of said first and/or second main error correcting means, and the output of said first or second latch in response to 3-1 and 3-2 control signals; and a first buffer for buffering said data synthesized in said data selecting means and outputting said buffered data to said data storing portion in word units;

wherein said 2-1, 2-2, 3-1, and 3-2 control signals are generated in response to the presence or absence of an error, the number of errors, and said 1-1 and 1-2 control signals, and the 1-1 or 1-2 control signal is either a flag signal for indicating impossible error correction or a signal indicating the location of an error.

7. An error correcting device as claimed in claim 6, wherein said data selecting means comprises:

a first multiplexer for selectively outputting said data latched in said first latch and the output of said first main error correcting means in response to said 3-1 control signal;

a second multiplexer for selectively outputting said data latched in said second latch and the output of said second main error correcting means in response to said 3-2 control signal; and a second buffer for latching the output of said first and second multiplexers and outputting said latched data to said first buffer.

8. An error correcting device as claimed in claim 7, in a digital decoder having address generating means for receiving the 1-1 or 1-2 control signal and outputting the address of data stored in said data input portion: and further comprising:

a third buffer for latching the 1-1 control signal generated in said first main error correcting means and outputting said latched 1-1 control signal to said address generating means; and fourth buffer for latching the 1-2 control signal output from said second main error correcting means and outputting said latched 1-2 control signal to said address generating means.

9. An error correcting device as claimed in claim 7, wherein said first main error correcting means comprises:

first syndrome calculating means for calculating syndromes from said MSB data received from said first latch;

first error calculating means for determining the presence or absence of an error, the number of errors, and the location and value of an error from said syndromes calculated in said first syndrome calculating means; and first MSB error correcting means for receiving the data latched in said first latch and said error value calculated in said first error calculating means, correcting an error in response to said 2-1 control signal, and outputting error-corrected data to said data selecting means.

10. An error correcting device as claimed in claim 6, and further comprising:

a third buffer for latching the 1-1 control signal generated in said first main error correcting means and outputting said latched 1-1 control signal to said address generating means; and a fourth buffer for latching the 1-2 control signal output from said second main error correcting means and outputting said latched 1-2 control signal to said address generating means.

11. An error correcting device as claimed in claim 6, wherein said first main error correcting means comprises:

first syndrome calculating means for calculating syndromes from said MSB data received from said first latch;

first error calculating means for determining the presence or absence of an error, the number of errors, and the location and value of an error from said syndromes calculated in said first syndrome calculating means; and first MSB error correcting means for receiving the data latched in said first latch and said error value calculated in said first error calculating means, correcting an error in response to said 2-1 control signal, and outputting error-corrected data to said data selecting means.

12. An error correcting device as claimed in claim 6, wherein said second main error correcting means comprises:

second syndrome calculating means for calculating syndromes from said LSB data received from said second latch;

second error calculating means for determining the presence or absence of an error, the number of errors, and the location and value of an error from said syndromes calculated in said second syndrome calculating means; and second MSB error correcting means for receiving the data latched in said second latch and said error value calculated in said second error calculating means, correcting an error in response to said 2-2 control signal, and outputting error-corrected data to said data selecting means.

13. A method of error correction of Reed-Solomon encoded digital data comprising the steps of:

partitioning a sector of the encoded digital data so as to form an MSB plane of data and an LSB plane of data;

byte-sequentially processing a codeword of the MSB plane so as to calculate MSB syndromes;

substantially simultaneously with said processing a codeword of the MSB plane, also processing a corresponding codeword of the LSB plane so as to calculate LSB syndromes;

responsive to the caculated MSB syndromes, correcting an error detected in the MSB plane data so as to form a corrected MSB byte;

responsive to the caculated LSB syndromes, correcting an error detected in the LSB plane data so as to form a corrected MSB byte;

for each byte of the of the MSB codeword, selecting the uncorrected byte of data if no error was detected, otherwise selecting the corrected MSB byte;

for each byte of the of the LSB codeword, selecting the uncorrected byte of data if no error was detected, otherwise selecting the corrected LSB byte; and combining the selected MSB byte together with the selected LSB byte to form a corrected word unit.

* * * * *

UNITED STATES PATENT AND TRADEMARK OFFICE
CERTIFICATE OF CORRECTION

PATENT NO. : 6,058,499 Page 1 of 1
DATED : May 2, 2000
INVENTOR(S) : Sim

It is certified that error appears in the above-identified patent and that said Letters Patent is hereby corrected as shown below:

Drawings,
In Fig. 7, "DATA SELECTING PORION" should read -- DATA SELECTING PORTION --.

Column 2,
Line 17, "SO and SI" should read -- S0 and S1 --.

Column 3,
Lines 27 and 28, "caculated" should read -- calculated --.
Lines 29 and 33, "byte of the of the" should read -- byte of the --.

Column 7,
Line 33, data DO" should read -- data D0 --.

Column 12,
Line 37 and 40, "caculated" should read -- calculated --.
Line 43 and 46, "byte of the of the" should read -- byte of the --.

Signed and Sealed this

Thirtieth Day of July, 2002

Attest:

JAMES E. ROGAN
Attesting Officer  Director of the United States Patent and Trademark Office